US010833211B2

(12) United States Patent
Newell et al.

(10) Patent No.: US 10,833,211 B2
(45) Date of Patent: Nov. 10, 2020

(54) HIGH OPTICAL POWER LIGHT CONVERSION DEVICE USING A PHOSPHOR ELEMENT WITH SOLDER ATTACHMENT

(71) Applicant: Materion Corporation, Mayfield Heights, OH (US)

(72) Inventors: Michael P. Newell, Groton, MA (US); Zan Aslett, Brookline, NH (US); Robert Cuzziere, Westford, MA (US); Andrew P. Houde, Lowell, MA (US); Derrick Brown, Hamilton (CA)

(73) Assignee: Materion Corporation, Mayfield Heights, OH (US)

( * ) Notice: Subject to any disclaimer, the term of this patent is extended or adjusted under 35 U.S.C. 154(b) by 140 days.

(21) Appl. No.: 15/274,288

(22) Filed: Sep. 23, 2016

(65) Prior Publication Data

US 2017/0092786 A1 Mar. 30, 2017

Related U.S. Application Data

(60) Provisional application No. 62/265,117, filed on Dec. 9, 2015, provisional application No. 62/232,702, filed on Sep. 25, 2015.

(51) Int. Cl.
*H01L 33/50* (2010.01)
*H01L 31/0232* (2014.01)
(Continued)

(52) U.S. Cl.
CPC ...... *H01L 31/02327* (2013.01); *C03C 14/006* (2013.01); *C04B 37/026* (2013.01);
(Continued)

(58) Field of Classification Search
CPC .. G21K 4/00; G21K 2004/06; C09K 11/7733; G01T 1/2992; G03B 42/04
See application file for complete search history.

(56) References Cited

U.S. PATENT DOCUMENTS

2002/0123164 A1* 9/2002 Slater, Jr. ............... H01L 33/20
438/39
2003/0039120 A1* 2/2003 Cao ........................ F21V 3/04
362/227

(Continued)

FOREIGN PATENT DOCUMENTS

| CN | 104566229 A | 4/2015 |
| DE | 102013206133 A1 | 10/2014 |
| WO | WO 2014/084489 A1 | 6/2014 |

OTHER PUBLICATIONS

Taiwan Office Action for Taiwan Application No. 105130995 dated Aug. 2, 2017.

*Primary Examiner* — David P Porta
*Assistant Examiner* — Mamadou Faye
(74) *Attorney, Agent, or Firm* — Tucker Ellis LLP

(57) ABSTRACT

A light generator comprises a light conversion device and a light source arranged to apply a light beam to the light conversion element. The light conversion device includes an optoceramic or other solid phosphor element comprising one or more phosphors embedded in a ceramic, glass, or other host, a metal heat sink, and a solder bond attaching the optoceramic phosphor element to the metal heat sink. The optoceramic phosphor element does not undergo cracking in response to the light source applying a light beam of beam energy effective to heat the optoceramic phosphor element to the phosphor quenching point.

25 Claims, 3 Drawing Sheets

(51) Int. Cl.
*H01L 31/024* (2014.01)
*H01L 31/18* (2006.01)
*C03C 14/00* (2006.01)
*C04B 37/02* (2006.01)
*G03B 21/20* (2006.01)
*G03B 21/16* (2006.01)
*H01L 33/64* (2010.01)

(52) U.S. Cl.
CPC ......... *G03B 21/16* (2013.01); *G03B 21/204* (2013.01); *H01L 31/024* (2013.01); *H01L 31/18* (2013.01); *C04B 2237/122* (2013.01); *C04B 2237/123* (2013.01); *C04B 2237/125* (2013.01); *C04B 2237/127* (2013.01); *C04B 2237/34* (2013.01); *C04B 2237/341* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/72* (2013.01); *C04B 2237/84* (2013.01); *H01L 33/501* (2013.01); *H01L 33/505* (2013.01); *H01L 33/507* (2013.01); *H01L 33/644* (2013.01)

(56) References Cited

U.S. PATENT DOCUMENTS

| | | | |
|---|---|---|---|
| 2003/0081902 A1* | 5/2003 | Blauvelt | G02B 6/12002 385/50 |
| 2005/0117302 A1* | 6/2005 | Emoto | H01L 23/367 361/704 |
| 2008/0093712 A1* | 4/2008 | Zenz | H01L 23/552 257/659 |
| 2008/0149166 A1* | 6/2008 | Beeson | H01L 31/02322 136/248 |
| 2012/0147913 A1* | 6/2012 | Ushinsky | C30B 29/28 372/34 |
| 2013/0264970 A1* | 10/2013 | Kuan | H01L 33/60 315/312 |
| 2013/0265561 A1* | 10/2013 | Takahira | F21V 7/06 356/3 |
| 2014/0175634 A1* | 6/2014 | Bai | H01L 23/293 257/737 |
| 2015/0316839 A1* | 11/2015 | Jeoung | G03B 21/204 353/20 |
| 2016/0071814 A1* | 3/2016 | Kroener | B23K 1/0016 228/194 |

* cited by examiner

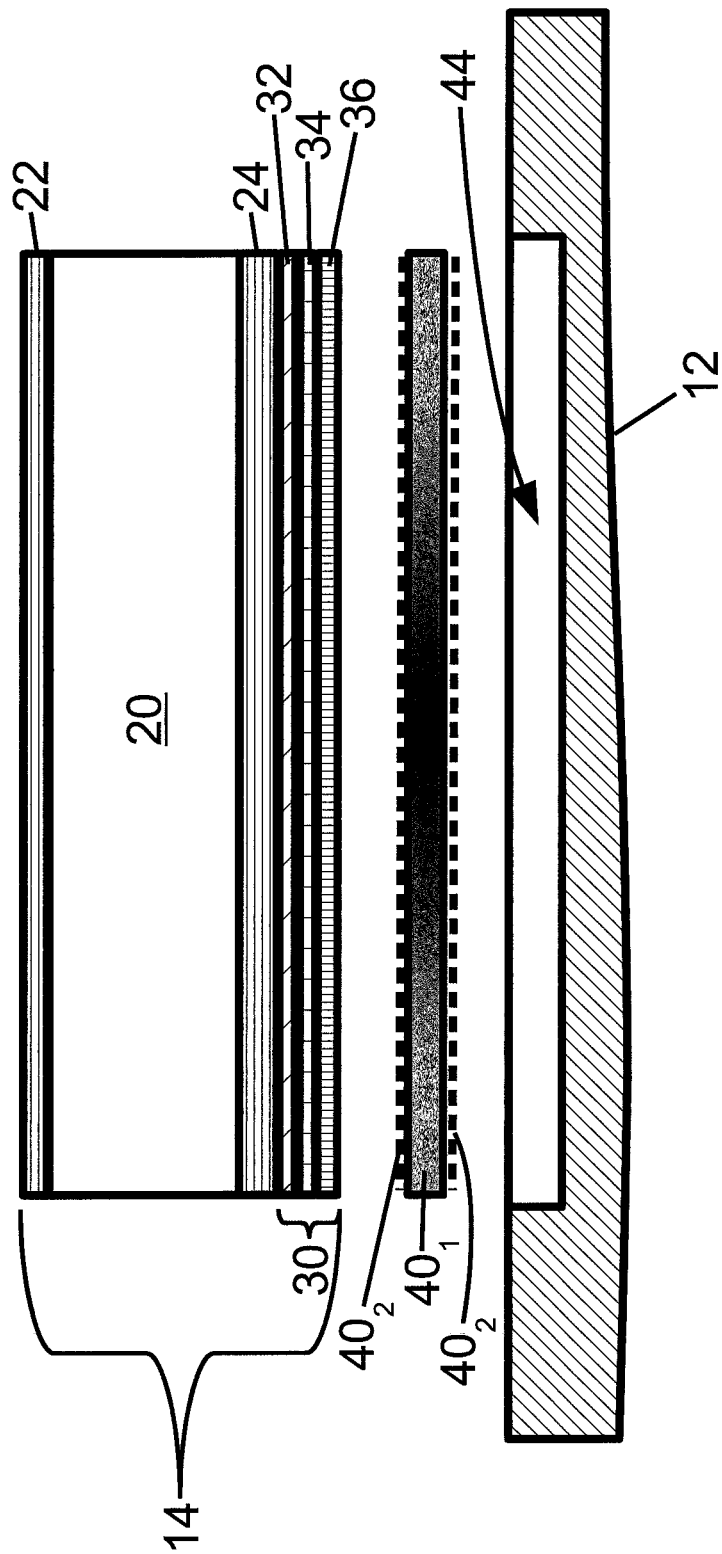

HIGH OPTICAL POWER LIGHT CONVERSION DEVICE USING A PHOSPHOR ELEMENT WITH SOLDER ATTACHMENT

This application claims the benefit of U.S. Provisional Application No. 62/265,117 filed Dec. 9, 2015 and titled "HIGH OPTICAL POWER LIGHT CONVERSION DEVICE USING A PHOSPHOR ELEMENT WITH GLASS HOST". U.S. Provisional Application No. 62/265,117 filed Dec. 9, 2015 is incorporated herein by reference in its entirety.

This application claims the benefit of U.S. Provisional Application No. 62/232,702 filed Sep. 25, 2015 and titled "HIGH OPTICAL POWER LIGHT CONVERSION DEVICE USING AN OPTOCERAMIC PHOSPHOR ELEMENT WITH SOLDER ATTACHMENT". U.S. Provisional Application No. 62/232,702 filed Sep. 25, 2015 is incorporated herein by reference in its entirety.

BACKGROUND

The following relates to the optical arts, phosphor arts, wavelength conversion arts, and related arts, and to optoelectronic, photonic, and like applications using same such as (but not limited to) projection displays (e.g. digital light processing, DLP), automotive lighting, and so forth.

Phosphor devices are known for converting light wavelength, usually down-converting from a shorter wavelength to one or more longer wavelengths. In a common approach, phosphor materials are dispersed in a transparent or translucent binder material such as epoxy, silicone, or so forth. The phosphor is energized, or "pumped" by a laser or other pump light source to emit phosphorescence. The phosphor device may be static, or may be configured as a phosphor wheel in which the phosphor is disposed near the outer rim of a rotating wheel. The phosphor wheel design advantageously can provide a time sequence of different colors (or more generally different spectra) by using different phosphors in different phosphor arc segments. Periods of zero emission can also be provided by leaving arced gaps between phosphor arc segments. Such a wheel can be used, for example, to provide sequential red, green, and blue light for a Digital Light Processing (DLP) projector or other DLP display device.

A problem arises for high optical power applications in that binder materials typically used in phosphors are susceptible to thermal damage due to heating by a high power pump laser. For example, in a typical down-conversion task in which a blue or ultraviolet laser is converted to white light (or to yellowish light that blends with blue pump laser light to form white light), the laser power may be on the order of 25 watts or higher, leading to significant heating.

A solution to this problem is to replace the binder material with a ceramic material, i.e. using an optoceramic phosphor. Typical ceramic materials are manufactured by sintering a mixture of powdered base material, binder, and stabilizer at elevated temperature, and optionally under elevated pressure. Other manufacturing processes such as chemical vapor deposition (CVD) or chemical reactions may be incorporated into the ceramic manufacturing process. For an optoceramic phosphor, the base material is chosen to include the desired phosphor component(s), and the mixture and sintering are designed to produce host material that is optically transmissive over the operational spectrum (including both the pump light and the phosphorescence). Ceramic materials are denser than a conventional phosphor binder material such as epoxy or silicone, and an optoceramic phosphor is typically thermally resistant at least up to the sintering temperature which is usually at least several hundred degrees Celsius, and may be as high as 1000° C. or more depending upon the sintering process. Consequently, optoceramic phosphors are expected to be thermally stable when pumped by a high power laser.

Some commercially available optoceramic phosphors include yttrium aluminum garnet (YAG), cerium-doped YAG (YAG:Ce), lutetium YAG (LuYAG), silicate-based phosphors, silicon-aluminum-oxynitride (SiAlON) phosphors, or so forth embedded in a ceramic host such as such as polycrystalline alumina ($Al_2O_3$, PCA), lanthana-doped yttria ($Y_2O_3$—$La_2O_3$), yttrium aluminum garnet ($Y_3Al_5O_{12}$), magnesium aluminate spinel ($MgAl_2O_4$), dysprosia ($Dy_2O_3$), aluminum oxynitride ($Al_{23}O_{27}N_5$), aluminum nitride (AlN), or so forth. See, e.g. Raukas et al., "Ceramic Phosphors for Light Conversion in LEDs", ECS Journal of Solid State Science and Technology, vol. 2 no. 2, pages R3168-76 (2013).

Some improvements are disclosed herein.

BRIEF DESCRIPTION

In accordance with some disclosed embodiments, a light conversion device comprises: an optoceramic phosphor element comprising one or more phosphors embedded in a ceramic host; a metal heat sink; and a solder bond attaching the optoceramic phosphor element to the metal heat sink.

In accordance with some disclosed embodiments, a light conversion device comprises a phosphor element comprising one or more phosphors embedded in a solid host element, a metal heat sink, and a solder bond attaching the phosphor element to the metal heat sink. In some embodiments the phosphor element comprises one or more phosphors embedded in a solid glass host element.

In accordance with some disclosed aspects, a light generator comprises a light conversion device as set forth in one of the two immediately preceding paragraphs, and a light source arranged to apply a light beam to the light conversion element. The optoceramic phosphor element does not undergo cracking in response to the light source applying a light beam of beam energy effective to heat the optoceramic phosphor element to the phosphor quenching point.

In accordance with some disclosed embodiments, a method of fabricating a light conversion device comprises: depositing a solderable metal stack on a back side of an optoceramic phosphor element comprising one or more phosphors embedded in a ceramic host; and attaching the optoceramic phosphor element to a metal heat sink by soldering the solderable metal stack to the heat sink.

In accordance with some disclosed embodiments, a method is disclosed of fabricating a light conversion device. The method comprises depositing a solderable metal stack on a back side of a phosphor element comprising one or more phosphors embedded in a solid host element, and attaching the phosphor element to a metal heat sink by soldering the solderable metal stack to the heat sink.

BRIEF DESCRIPTION OF THE DRAWINGS

FIG. 3 shows a variant embodiment in which the heat sink (e.g. metal wheel of FIG. 1) has a recess shaped and sized to receive at least the solder attachment and optionally a lower portion of the phosphor element.

DETAILED DESCRIPTION

Figure 1:
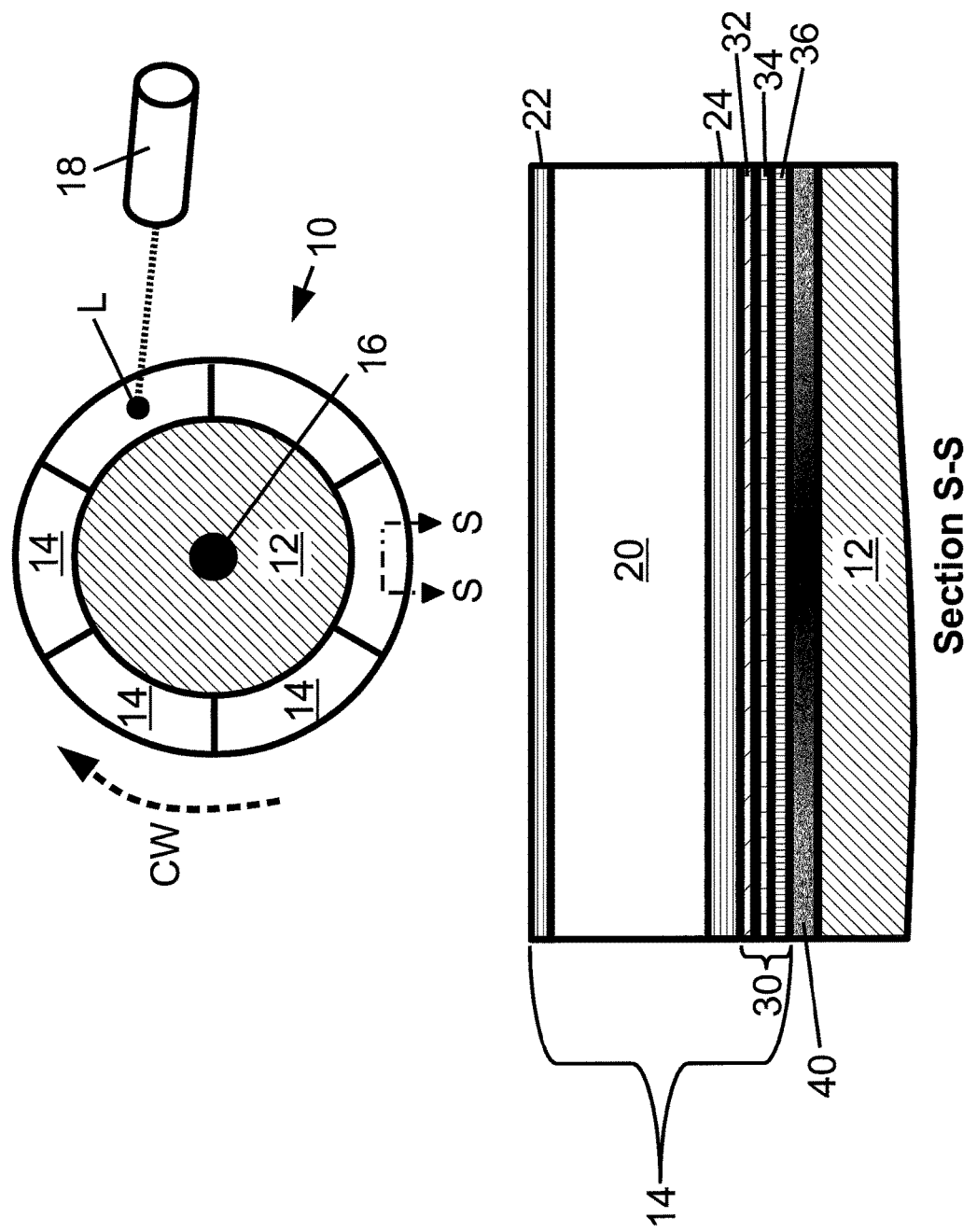
FIG. 1 illustrates a phosphor wheel including six phosphor arc segments. Section S-S of FIG. 1 shows a cross-section of a portion of one of the phosphor elements and its solder attachment to the metal wheel.

As used herein, and as is conventional in the art, terms such as "optical spectrum", "optical", "wavelength", "frequency", "light", "light beam", and so forth are not limited to the visible spectrum but rather for a given filter may extend into, or reside entirely within, the infrared and/or ultraviolet spectral regions.

Contrary to the expectation that optoceramic phosphors are expected to be thermally stable when pumped by a high power laser, the inventors have found that in practice an optoceramic phosphor undergoes destructive failure as the output of the high-power pump laser is ramped up. Specifically, a static optoceramic phosphor element mounted on a heat sink using adhesive or thermal paste undergoes destructive cracking during high power pump laser ramp-up.

As disclosed herein, the inventors have found that this catastrophic cracking failure mode can be overcome by employing a solder connection of the optoceramic phosphor to a heat sink (e.g. Al or Cu). With the solder attachment, the pump laser power could be ramped up to pump power high enough to produce phosphor quenching without cracking the optoceramic phosphor element. Without being limited to any particular theory of operation, it is believed that the catastrophic failure mode is due to insufficient heat transfer out of the optoceramic phosphor, either in terms of the thermal resistance of the attachment or in terms of thermal reactance of the attachment (i.e. delay before heat transfer ramps up), and the solder attachment improves the heat transfer through the attachment sufficiently to overcome the catastrophic cracking failure mode. In view of this, it is contemplated to employ other attachment bonds, besides a solder bond, that provide the requisite heat transfer properties. For example, it is contemplated to replace the solder bond with a bond formed by sintering a powder or paste of silver (Ag) nanoparticles in an organic thinner (to provide uniform dispersion). The sintering is suitably performed at a temperature below the silver melting temperature, e.g. at ~250° C. in some embodiments although the optimal process temperature depends on factors such as Ag nanoparticle size, density, and average surface area. While the sintering is occurring, slight pressure may optionally be applied, and/or the sintering may optionally be performed in a controlled atmosphere. After sintering, the silver will be operable to a much higher temperature than the sintering temperature. Without being limited to any particular theory of operation, the bonding process in this approach is believed to be attributable to an atomic diffusion mechanism.

More generally, as disclosed herein a solder connection is used to attach a solid phosphor element to a heat sink (e.g. Al or Cu). The solder attachment is expected to improve the heat transfer through the attachment sufficiently to overcome the catastrophic cracking or other thermal failure mode. In view of this, it is contemplated to employ other attachment bonds, besides a solder bond, that provide the requisite heat transfer properties.

The solder bond approach disclosed herein is expected to provide benefits for various types of high-temperature phosphor elements, such as single-crystal or polycrystalline phosphor elements, glass phosphor elements, or so forth, in which the phosphor is incorporated into a crystal, glass, or other solid host material. The solder bond approach disclosed herein is expected to provide similar benefits for other types of high-temperature phosphor elements, such as single-crystal or polycrystalline phosphor elements in which the phosphor is incorporated into a crystal having high thermal stability during the crystal growth process.

FIG. 1 diagrammatically shows a phosphor wheel 10 including a metal disk or "wheel" 12 made of copper, a copper alloy, an aluminum alloy, or so forth. One or more optoceramic phosphor elements, e.g. arc segments 14, are attached to an outer perimeter of the wheel 12, that is, are attached at or near the outer rim of the wheel 12. The metal disk or wheel 12 thus serves as both a carrying component and as a heat sink for the optoceramic phosphor arc segments 14. The illustrative optoceramic phosphor arc segments 14 are geometrically advantageous design that minimizes the amount of optoceramic phosphor material while enabling phosphor coverage of the entire wheel circumference. The illustrative phosphor wheel 10 includes six optoceramic phosphor arc segments 14 of equal size; however, more or fewer phosphor arc segments can be employed (including as few as a single optoceramic phosphor arc segment forming a complete 360° circle). While the illustrative six optoceramic phosphor arc segments 14 are commonly illustrated and labeled, it will be appreciated that different optoceramic phosphor arc segments can include different phosphors (for example, to emit phosphorescence of different colors), and/or there may be gaps between neighboring optoceramic phosphor arc segments. In operation the metal wheel 12 is rotated about a central axis 16, for example, by connecting a motor shaft of a motor (not shown) to the central axis 16 and operating the motor to rotate the phosphor wheel 10 in an illustrated clockwise direction CW (counterclockwise rotation is also contemplated). Simultaneously with the rotation, pump light is applied to a local region—this is diagrammatically indicated in FIG. 1 by a laser 18 applying an illustrative pump laser beam spot L. As the metal wheel 12 rotates it carries the optoceramic phosphor arc segments 14 in sequence into contact with the laser beam L to emit phosphorescence. It will be readily appreciated that by suitable selection of the phosphors of the various optoceramic phosphor arc segments 14, various color time sequences can be generated, such as red-green-blue-red-green-blue as may be appropriate in a DLP display application.

Figure 2:
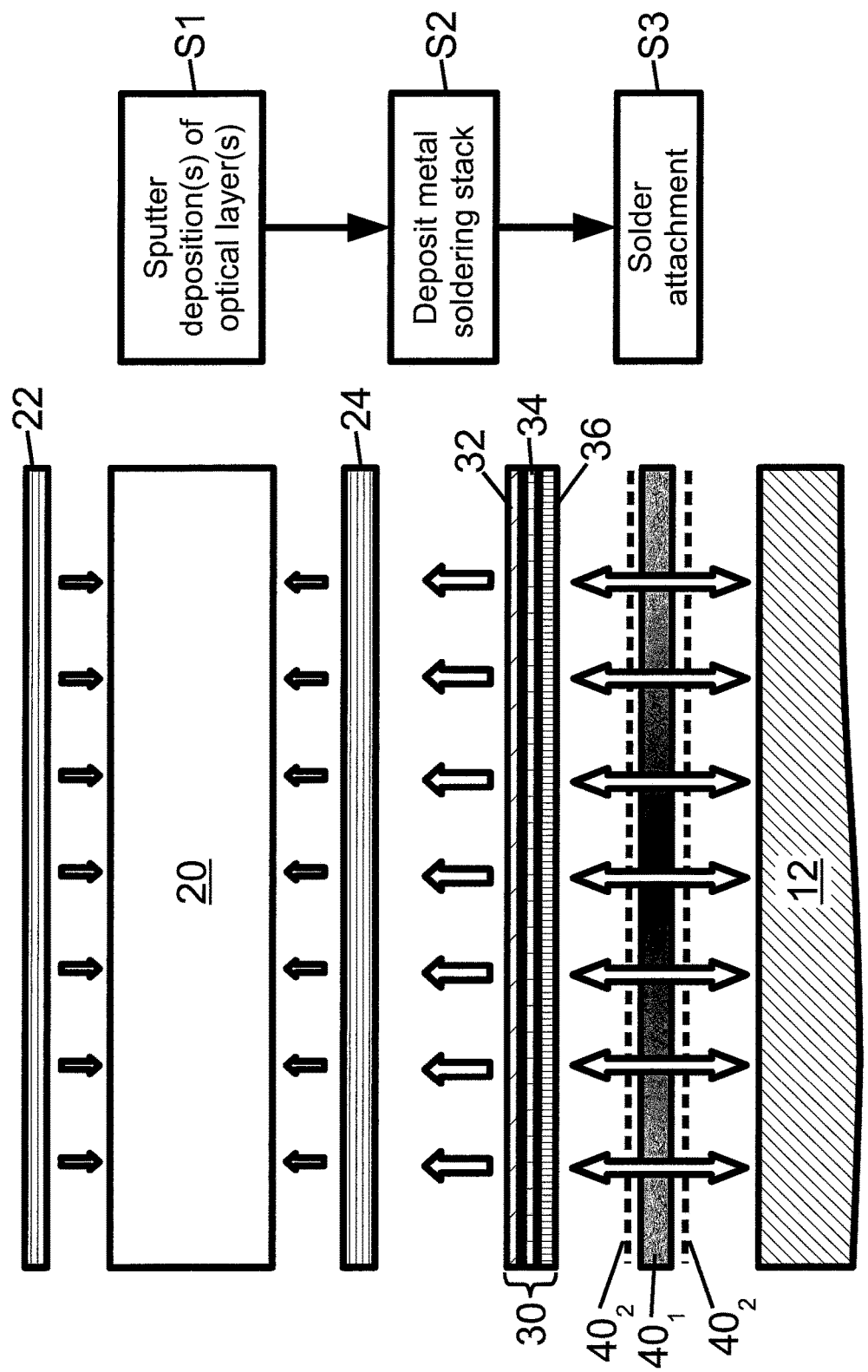
FIG. 2 shows an exploded view of Section S-S of FIG. 1 (left side) and a flow chart diagrammatically indicating principal manufacturing operations (right side).

With continuing reference to FIG. 1 and with further reference to FIG. 2, Section S-S diagrammatically illustrates a cross-section of a portion of one optoceramic phosphor arc segment 14 and its solder attachment to the metal wheel 12. FIG. 2 shows an exploded view of Section S-S (left side) and a flow chart diagrammatically indicating principal manufacturing operations (right side). It is noted that layer thicknesses are not drawn to scale in diagrammatic Section S-S of FIG. 1 and its exploded view shown in FIG. 2. The optoceramic phosphor arc segment 14 includes an optoceramic phosphor element 20 which may, by way of non-limiting illustration, comprise a phosphor such as yttrium aluminum garnet (YAG), cerium-doped YAG (YAG:Ce), lutetium YAG (LuYAG), silicate-based phosphors, silicon-aluminum-oxynitride (SiAlON) phosphors, or so forth embedded in a ceramic material that is optically transmissive in the visible spectrum, such as polycrystalline alumina ($Al_2O_3$, PCA), lanthana-doped yttria ($Y_2O_3$—$La_2O_3$), yttrium aluminum garnet ($Y_3Al_5O_{12}$), magnesium aluminate spinel ($MgAl_2O_4$), dysprosia ($Dy_2O_3$), aluminum oxynitride ($Al_{23}O_{27}N_5$), aluminum nitride (AlN), or so forth. See, e.g. Raukas et al., "Ceramic Phosphors for Light Conversion in LEDs", ECS Journal of Solid State Science and Technology, vol. 2 no. 2, pages R3168-76 (2013). In other embodiments, the phosphor element arc segment 14 includes a phosphor element 20 which may, by way of non-limiting illustration, comprise a phosphor such as yttrium aluminum garnet (YAG), cerium-doped YAG (YAG:Ce), lutetium YAG (LuYAG), silicate-based phosphors, silicon-aluminum-oxynitride (SiAlON) phosphors, or so forth embedded in a crystalline, glass, or other solid host element made of a material that is optically transmissive in the visible spectrum. For example, the host material can be a glass such as B270, BK7, P-SF68, P-SK57Q1, P-SK58A, P-BK7, or so forth.

The phosphor or phosphor dopant may be suitably chosen to emit the desired emission light, e.g. green, yellow, red, or light combination such as a white phosphor blend. The optoceramic phosphor element 20 may be manufactured using any suitable process such as (by way of non-limiting illustration) sintering a mixture of powdered base material, binder, and stabilizer at elevated temperature. In other embodiments, e.g. using a glass host material, the phosphor element 20 may be manufactured using a suitable process such as (by way of non-limiting illustration) melting, molding, sintering or so forth.

In the illustrative examples, an optoceramic phosphor element is assumed for illustration. Optionally, one or more optical coatings may be applied to one or more surfaces of the optoceramic phosphor element 20. For illustrative purposes, the optoceramic phosphor arc segment 14 includes a front-side anti-reflection (AR) coating 22 and a back-side dielectric or metal or hybrid dielectric/metal mirror coating 24. (The term "front-side" as used herein denotes the side of the optoceramic phosphor element 20 at which the beam from the pump laser 18 or other pump light beam impinges; while the term "back-side" as used herein denotes the side of the optoceramic phosphor element 20 which is attached to the heat sink 12 (where, again, in the illustrative example the metal wheel 12 of the phosphor wheel 10 serves as the heat sink for the optoceramic phosphor element 20). The AR coating 22 is designed to minimize reflection of the pump laser light impinging on the optoceramic phosphor element 20 while not impeding emission of the phosphorescence. The dielectric mirror coating 24 is designed to reflect the phosphorescence, and optionally is also designed to reflect the pump laser light. As indicated in FIG. 2, these coatings may be applied by sputter deposition S1, although any other deposition technique suitable for depositing the materials that make up these coatings 22, 24 can be used to perform the deposition(s) S1. It will also be appreciated that either one, or both, of the optical coatings 22, 24 may be omitted, and/or other optical coatings can be provided such as a wavelength-selective filter coating, a light-scattering coating, a deposited Fresnel lens, or so forth.

With continuing reference to FIGS. 1 and 2, the optoceramic phosphor element 20 and the dielectric or metal mirror coating 24 (if present) typically are not materials that are well-suited to solder bonding. To facilitate attachment of the optoceramic phosphor arc segment 14 to the metal wheel 12 by way of soldering, the optoceramic phosphor arc segment 14 further includes a solderable metal stack 30 is deposited on the back side of the optoceramic phosphor element 20 (or, more particularly in the illustrative example, on the back side of the dielectric mirror coating 24). The solderable metal stack 30 can include as few as a single metal layer; in the illustrative embodiment, the solderable metal stack 30 includes: an adhesion layer 32 adjacent the element 20 of (by way of non-limiting illustrative example) chromium or titanium or a titanium-tungsten (TiW) alloy; a diffusion barrier layer 34 of (by way of non-limiting illustrative example) nickel; and a solderable metal layer 36 of (by way of non-limiting illustrative example) gold. This is merely an illustrative example, and numerous solderable solder stacks known in the art for facilitating soldering of non-metallic elements to a metal element can be employed. By way of some further non-limiting illustrative examples: the solderable metal layer 36 could be silver, platinum, or another solder-compatible metal or metal sub-stack rather than gold; the nickel diffusion barrier layer can include a few percent (e.g. 5%) vanadium to reduce its magnetic properties so as to facilitate deposition by magnetron sputtering; the diffusion barrier layer 34 can be omitted entirely and/or the adhesion layer 32 can be omitted entirely; and so forth. As indicated in FIG. 2, the solderable metal stack 30 may, for example, be deposited on the back side of the optoceramic phosphor element 20 (or, more particularly in the illustrative example, on the back side of the dielectric mirror coating 24) in a metal deposition operation S2 by sputtering, plating, vacuum metal evaporation (e.g. using electron beam evaporation, thermal evaporation), or so forth, although any other deposition technique suitable for depositing the materials that make up these solderable metal stack 30 can be used to perform the deposition(s) S1.

With continuing reference to FIGS. 1 and 2, the optoceramic phosphor arc segment 14 including the optoceramic phosphor element 20, the optional optical coatings 22, 24, and the solderable metal stack 30 is attached to the metal substrate 12 (the metal wheel 12 in the illustrative example of FIG. 1) by a solder operation S3 which forms a solder bond 40. In one suitable approach diagrammatically illustrated in FIG. 2, the solder operation S3 entails placing the optoceramic phosphor arc segment 14 onto the metal heat sink 12 with a solder preform $40_1$ coated with solder flux $40_2$ interposed between the optoceramic phosphor arc segment 14 and the metal heat sink 12. In another contemplated embodiment, the solder flux is mixed into the solder preform rather than being coated on the solder preform. A wide range of solder alloys can be used for the solder preform $40_1$ such as, by way of non-limiting example, a lead/indium/silver solder alloy, a gold/tin solder alloy, a gold-silicon (AuSi) alloy, or so forth. This assembly is then heated to a soldering temperature which is effective to cause the solder $40_1$, $40_2$ to form the solder bond 40 between the solderable metal stack 30 and the metal heat sink 12. Other approaches are contemplated for performing the solder operation S3, such as employing a solder gun to dispose pre-mixed solder material and flux onto one or both of the surfaces to be soldered together and then pressing them together. For commercial manufacturing, the solder bonding operation S3 should be an automated process with high throughput.

With brief reference to FIG. 3, in a variant embodiment the heat sink substrate 12 to which the solder attachment is to be made includes a recess 44 shaped and of sufficient depth to receive the solder preform $40_1$ coated with solder flux $40_2$, so as to facilitate the solder operation S3. The resulting device will then have the solder bond 40 disposed in the recess 44. Optionally, the recess 44 may be deep enough to receive a lower portion of the optoceramic phosphor arc segment 14 as well, so that the resulting device has the solder bond 40 and a lower portion of the optoceramic phosphor element 20 disposed in the recess 44.

The illustrative embodiment pertains to the phosphor wheel 10 of FIG. 1. However, it will be appreciated that the disclosed approach for solder attachment of the optoceramic phosphor element 20 to a metal heat sink 12 is equally applicable for attaching static phosphor elements to a heat sink. For example, in one application, the optoceramic phosphor element 20 contains one or more phosphors that generate yellow or yellowish phosphorescence, and the pump laser beam is a blue laser beam. By appropriate tuning of the phosphor concentration in the optoceramic phosphor element 20 and the blue pump beam power, a mixture of blue pump light and yellow or yellowish phosphorescence is generated that approximates white light. The optoceramic phosphor element may be employed in any desired optical system. As one non-limiting example, a static optoceramic phosphor element soldered to a heat sink as disclosed herein may be employed in conjunction with a light tunnel, where the high optical power in the light tunnel is accommodated by efficient heat transfer from the optoceramic phosphor element to the heat sink via the solder bond as disclosed herein.

In experimental tests, optoceramic phosphor elements soldered to a copper heat sink have been tested, along with optoceramic phosphor elements attached to a copper heat sink by thermal paste for comparison. Some tested optoceramic phosphor elements included the front side AR coating 22 and the back side dielectric mirror coating 24, with the latter designed for a backside air interface. In tests, no cracking of optoceramic phosphor elements secured to the heat sink by soldering was observed for beam energies effective to heat the optoceramic phosphor element up to and beyond the phosphor quenching point. By contrast, optoceramic phosphor elements secured to the heat sink by thermal paste exhibited catastrophic cracking as pump laser power was increased, and this cracking occurred well before the phosphor quenching point was reached so that it limited thermal range of the device. Damage to the AR coating 22 was also observed in the optoceramic phosphor elements mounted using thermal paste, leading to a reduced laser induced damage (LITD) threshold as compared with optoceramic phosphor elements mounted using the disclosed solder bond. It was also surprisingly observed that the back side dielectric mirror coating 24 designed for a backside air interface provides substantial light output improvement in spite of the fact that the backside interface was to the solder bond 40, rather than to the design-basis air (refractive index n=1). Without being limited to any particular theory of operation, it is believed that this may be due to the multiple layers of the stack providing significant reflection such that the fraction of light reaching the backside mirror/solder interface is low.

These results demonstrate that the disclosed solder attachment approach enables construction of a passive light conversion device comprising an optoceramic phosphor element 20 comprising one or more phosphors embedded in a ceramic host, a metal heat sink 12, and a solder bond 40 attaching the optoceramic phosphor element 20 to the metal heat sink 12, which can operate with a pump beam energy of any value up to the phosphor quenching point without the optoceramic phosphor element 20 undergoing cracking. By contrast, the conventional thermal paste attachment resulted in catastrophic cracking well below the phosphor quenching point thereby limiting device performance. It is noted that the disclosed solder bond is providing improved device performance for passive optical elements which in many embodiments include no electrical or electronic components.

It will be appreciated that various of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. A light conversion device comprising:
an optoceramic phosphor element comprising one or more phosphors embedded in a ceramic host;
a solderable metal stack including one or more metal layers deposited onto a back side of the optoceramic phosphor element by sputtering, plating, or vacuum metal evaporation of material that make up the respective one or more metal layers;
a phosphor wheel including a metal heat sink which is a metal disk rotatable about a central axis of the metal disk;
a solder bond attaching the solderable metal stack to an outer rim of the metal disk; and
a mirror coating disposed on a back side of the optoceramic phosphor element between the optoceramic phosphor element and the solderable metal stack;
wherein the mirror coating is a dielectric mirror designed to operate with a backside air interface.

2. The light conversion device of claim 1 wherein the optoceramic phosphor element does not undergo cracking in response to an applied light beam with beam energy effective to heat the optoceramic phosphor element to the phosphor quenching point.

3. A light generator comprising:
a light conversion device as set forth in claim 1; and
a light source arranged to apply a light beam to the light conversion element;
wherein the optoceramic phosphor element does not undergo cracking in response to the light source applying a light beam of beam energy effective to heat the optoceramic phosphor element to the phosphor quenching point.

4. The light conversion device of claim 1, wherein one of the metal layers of the solderable metal stack includes an adhesion layer or a diffusion barrier layer.

5. The light conversion device of claim 1, wherein the solderable metal stack comprises:
the solderable metal layer;
an adhesion layer adjacent to the phosphor element; and
a diffusion barrier layer disposed between the adhesion layer and solderable metal layer.

6. The light conversion device of claim 5, wherein the adhesion layer comprises chromium or titanium, the diffusion barrier layer comprises nickel, and the solderable metal layer comprises gold or silver.

7. The light conversion device of claim 6 wherein the diffusion barrier layer of the solderable metal stack also includes vanadium.

8. The light conversion device claim 1:
wherein the metal heat sink includes a recess within which the solder bond is disposed.

9. The light conversion device of claim 8 wherein a lower portion of the optoceramic phosphor element is also disposed within the recess of the heat sink.

10. A light conversion device comprising:
a phosphor element comprising one or more phosphors embedded in a solid host element;
a dielectric mirror coating disposed on a back side of the phosphor element;

a solderable metal stack deposited on a back side of the dielectric mirror coating, wherein the dielectric mirror coating is disposed between the phosphor element and the solderable metal stack and wherein the dielectric mirror coating is a dielectric mirror designed to operate with a backside air interface;

a metal heat sink; and a solder bond attaching the solderable metal stack to the metal heat sink.

11. The light conversion device of claim 10 wherein the light conversion device is a phosphor wheel and the heat sink is a metal disk, and wherein the phosphor element is attached by the solder bond at the outer rim of the metal disk.

12. The light conversion device of claim 10, wherein the solderable metal stack comprises an adhesion layer adjacent to the phosphor element, a solderable metal layer, and a diffusion barrier layer disposed between the adhesion layer and solderable metal layer, wherein the adhesion layer comprises chromium or titanium, the diffusion barrier layer comprises nickel, and the solderable metal layer comprises gold or silver.

13. The light conversion device of claim 12 wherein the diffusion barrier layer of the solderable metal stack also includes vanadium.

14. The light conversion device of claim 10 wherein the metal heat sink includes a recess wherein which the solder bond is disposed.

15. The light conversion device of claim 14, wherein a lower portion of the phosphor element is also disposed within the recess of the heat sink.

16. The light conversion device of claim 10 wherein the phosphor element comprises one or more phosphors embedded in a solid glass host element.

17. The light conversion device of claim 16 wherein the solid glass host element comprises B270, BK7, P-SF68, P-SK57Q1, P-SK58A, or P-BK7.

18. A light generator comprising:
a light conversion device as set forth in claim 10; and
a light source arranged to apply a light beam to the light conversion element;
wherein the optoceramic phosphor element does not undergo cracking in response to the light source applying a light beam of beam energy effective to heat the optoceramic phosphor element to the phosphor quenching point.

19. A method of fabricating a light conversion device comprising:
depositing a solderable metal stack on a back side of an optoceramic phosphor element comprising one or more phosphors embedded in a ceramic host by sputtering, plating, or vacuum metal evaporation of material that make up the solderable metal stack;
prior to depositing the solderable metal stack on the back side of the optoceramic phosphor element, depositing a dielectric mirror coating on the back side of the optoceramic phosphor element, whereby the solderable metal stack is deposited on the dielectric mirror coating
providing a metal heat sink as a metal disk that is rotatable about a central axis of the metal disk; and
attaching the optoceramic phosphor element to an outer rim of the metal disk by soldering the solderable metal stack to the outer rim of the metal disk;
wherein the dielectric mirror coating is a dielectric mirror designed to operate with a backside air interface.

20. The method of claim 19 wherein the depositing of the solderable metal stack includes depositing an adhesion layer upon the back side of the phosphor element, depositing a diffusion barrier layer on the adhesion layer, and depositing a solderable metal layer on the diffusion barrier layer, wherein the adhesion layer comprises chromium or titanium, the diffusion barrier layer comprises nickel, and the solderable metal layer comprises gold or silver or platinum.

21. The method of claim 20 wherein the diffusion barrier layer also includes vanadium.

22. The method of claim 19 wherein the depositing of the solderable metal stack on the back side of the optoceramic phosphor element includes:
depositing a solderable silver, platinum, or gold layer as the solderable metal layer;
wherein the soldering comprises soldering the solderable silver, platinum, or gold layer to the heat sink.

23. The method of claim 19 wherein the attaching comprises:
disposing the optoceramic phosphor element onto the metal heat sink with a solder preform interposed between the optoceramic phosphor element and the metal heat sink to create an assembly; and
heating the assembly to a soldering temperature which is effective to cause the solder preform to form a solder bond between the solderable metal stack and the metal heat sink.

24. The method of claim 23 wherein the solder preform includes solder flux coated onto or mixed into the solder preform.

25. The method of claim 23 wherein the solder preform comprises a lead/indium/silver solder alloy or a gold/tin solder alloy.

* * * * *